United States Patent
Motonari et al.

(10) Patent No.: US 6,447,695 B1
(45) Date of Patent: Sep. 10, 2002

(54) AQUEOUS DISPERSION COMPOSITION FOR CHEMICAL MECHANICAL POLISHING FOR USE IN MANUFACTURE OF SEMICONDUCTOR DEVICES

(75) Inventors: Masayuki Motonari; Masayuki Hattori; Nobuo Kawahashi, all of Tokyo (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 09/655,305

(22) Filed: Sep. 5, 2000

(30) Foreign Application Priority Data

Sep. 6, 1999 (JP) ............................................ 11-251756

(51) Int. Cl.$^7$ ........................ C09K 13/00; C09K 13/06; H01L 21/302
(52) U.S. Cl. ...................... 252/79.1; 252/79.4; 438/692
(58) Field of Search ............................... 525/79.4, 79.1; 438/692

(56) References Cited

U.S. PATENT DOCUMENTS

| 3,948,703 A | * | 4/1976 | Kushibe ...................... 156/20 |
| 5,770,095 A | * | 6/1998 | Sasaki et al. .................. 216/38 |
| 5,897,375 A | * | 4/1999 | Watts et al. ................. 438/693 |
| 6,068,769 A | | 5/2000 | Iio et al. ..................... 210/315 |

FOREIGN PATENT DOCUMENTS

| EP | 0 846 742 | 6/1998 |
| JP | 7-176502 | 7/1995 |

OTHER PUBLICATIONS

U.S. patent application Ser. No. 09/820,749, filed Mar. 30, 2001, pending.
U.S. patent application Ser.No. 09/816,397, filed Mar. 26, 2001, pending.
U.S. patent application Ser. No. 09/655,305, filed Sep. 5, 2000, pending.
U.S. patent application Ser. No. 09/484,252, filed Jan. 18, 2000, pending.
U.S. patent application Ser. No. 09/638,062, filed Aug. 15, 2000, pending.

* cited by examiner

*Primary Examiner*—Benjamin L. Utech
*Assistant Examiner*—Lynette T. Umez-Eronini
(74) *Attorney, Agent, or Firm*—Oblon, Spivak, McClelland, Maier & Neustadt, P.C.

(57) ABSTRACT

The present invention provides an aqueous dispersion composition for chemical mechanical polishing which is useful for the manufacture of semiconductor devices, and which for polishing of different types of working films and barrier metal layers formed on semiconductor substrates, can achieve efficient polishing particularly of barrier metal surfaces and can give adequately flattened and high precision finished surfaces. The aqueous dispersion composition for chemical mechanical polishing has properties such that, when polishing a copper film, a tantalum layer and/or tantalum nitride layer a and an insulating film under the same conditions, the ratio ($R_{Cu}/R_{Ta}$) between the polishing rate of the copper film ($R_{Cu}$) and the polishing rate of the tantalum layer and/or tantalum nitride layer ($R_{Ta}$) is no greater than 1/20, and the ratio ($R_{Cu}/R_{In}$) between the polishing rate of the copper film ($R_{Cu}$) and the polishing rate of the insulating film ($R_{In}$) is from 5 to 1/5. $R_{Cu}/R_{Ta}$ is preferably no greater than 1/30, especially no greater than 1/40 and most preferably no greater than 1/50, while $R_{Cu}/R_{In}$ is preferably 4¼, especially 3⅓ and more preferably 2½.

21 Claims, No Drawings

AQUEOUS DISPERSION COMPOSITION FOR CHEMICAL MECHANICAL POLISHING FOR USE IN MANUFACTURE OF SEMICONDUCTOR DEVICES

BACKGROUND OF THE INVENTION

1. Field of the Invention

The present invention relates to an aqueous dispersion composition for chemical mechanical polishing for use in the manufacture of semiconductor devices (hereunder referred to as "aqueous dispersion composition for chemical mechanical polishing", or sometimes simply as "aqueous dispersion composition"). More specifically, the invention relates to an aqueous dispersion composition for chemical mechanical polishing that, for polishing of different types of working films and barrier metal layers formed on semiconductor substrates, can accomplish efficient polishing particularly of barrier metal layers and can give adequately flattened and high precision finished surfaces.

2. Description of the Prior Art

A recent technique used in the manufacture of semiconductor devices is a process whereby a wiring material such as tungsten, copper or the like is embedded in a hole or groove formed in an insulating film on a processing wafer and then polishing is performed to remove the wiring material above the surface of the insulating film to thereby complete formation of the wiring. Wiring formed by this process is called damascene wiring. This polishing cannot be very efficiently achieved on barrier metal layers made of metals with high hardness such as tantalum and the like. On the other hand, relatively soft wiring materials such as copper are easy to polish but exhibit dishing in the wiring sections, making it difficult to produce flat finished surfaces. In cases with a high pH, particularly with porous insulating films of low dielectric constant, the insulating film is excessively polished making it impossible to form satisfactory damascene wiring.

SUMMARY OF THE INVENTION

[Problems to Be Solved by the Invention]

The present invention solves the aforementioned problems of the prior art by providing a useful aqueous dispersion composition for chemical mechanical polishing in the manufacture of semiconductor devices, which is able to polish barrier metal layers made of tantalum and the like with sufficient rate, which gives sufficiently flat finished surfaces without excessively polishing wiring materials made of copper or the like or excessively polishing insulating films, and which can form satisfactory damascene wiring.

[Features of the Invention]

The aqueous dispersion composition for chemical mechanical polishing of the present invention is characterized by comprising a polishing agent, water and a polishing rate adjustor.

More, the aqueous dispersion composition for chemical mechanical polishing for use in the manufacture of semiconductor devices according to the another present invention, is characterized by comprising a polishing agent, water and a polishing rate adjustor, wherein, when polishing a copper film, a tantalum layer and/or tantalum nitride layer and an insulating film under the same conditions, the ratio ($R_{Cu}/R_{Ta}$) between the polishing rate of the copper film ($R_{Cu}$) and the polishing rate of the tantalum layer and/or tantalum nitride layer ($R_{Ta}$) is no greater than $1/20$, and the ratio ($R_{Cu}/R_{In}$) between the polishing rate of the copper film ($R_{Cu}$) and the polishing rate of the insulating film ($R_{In}$) is from 5 to $1/5$.

[Effect of the Invention]

According to the invention it is possible to obtain a useful aqueous dispersion composition for chemical mechanical polishing by preparing an aqueous dispersion composition containing a polishing rate adjustor.

By specifying the ratio between the polishing rates of for a copper film and a tantalum layer and/or tantalum nitride layer and the ratio between the polishing rates for a copper film and an insulating film, it is possible to polish barrier metal layers at a sufficient rate, to polish working films at an appropriate rate and to obtain an aqueous dispersion composition for chemical mechanical polishing which is useful for the manufacture of semiconductor devices, without excessive polishing of insulating films and without dishing.

Moreover, by specifying the function of the polishing rate adjustor or the type of polishing rate adjustor, and by specifying the pH, it is possible to easily obtain an aqueous dispersion composition for chemical mechanical polishing according to the invention.

DETAILED DESCRIPTION OF THE INVENTION

[Means for Solving the Problems]

As a result of research with the object of obtaining an aqueous dispersion composition for chemical mechanical polishing that can achieve adequate flattening of finished surfaces for polishing of working films formed on semiconductor substrates, it was found that by including a polishing rate adjustor comprising a heterocyclic compound with an amino group and the like, it is possible to accelerate polishing of barrier metal layers, inhibit polishing of wiring materials such as copper, and to obtain adequately flattened and highly precise finished surfaces without excessive polishing of insulating films. The present invention has been accomplished on the basis of this finding.

This object is achieved firstly by an aqueous dispersion composition containing a polishing rate adjustor. The object is achieved secondly by an aqueous dispersion composition for chemical mechanical polishing with a specified ratio between the polishing rates of a copper film and a tantalum layer and/or tantalum nitride layer and between the polishing rates of a copper film and an insulating layer. The object is achieved thirdly by an aqueous dispersion composition containing a polishing rate adjustor with a specific function. The object is achieved fourthly by an aqueous dispersion composition containing a specific heterocyclic compound as the polishing rate adjustor. The object is achieved fifthly by an aqueous dispersion composition with a specific pH.

The aqueous dispersion composition for chemical mechanical polishing of the present invention is characterized by comprising a polishing agent, water and a polishing rate adjustor.

More, the aqueous dispersion composition for chemical mechanical polishing for use in the manufacture of semiconductor devices according to the another present invention, is characterized by comprising a polishing agent, water and a polishing rate adjustor, wherein, when polishing a copper film, a tantalum layer and/or tantalum nitride layer and an insulating film under the same conditions, the ratio ($R_{Cu}/R_{Ta}$) between the polishing rate of the copper film ($R_{Cu}$) and the polishing rate of the tantalum layer and/or tantalum nitride layer ($R_{Ta}$) is no greater than $1/20$, and the ratio ($R_{Cu}/R_{In}$) between the polishing rate of the copper film ($R_{Cu}$) and the polishing rate of the insulating film ($R_{In}$) is from 5 to ⅕.

The copper which may form the "copper film" includes not only pure copper, but also alloys containing at least 95 wt % copper, such as copper-silicon, copper-aluminum and the like. The tantalum which may form the "tantalum layer" is also not limited to pure tantalum, and includes tantalum-containing alloys such as tantalum-niobium. The tantalum nitride which may form the "tantalum nitride layer" is also not limited to pure products.

The phrase "under the same conditions" used above means that the same polishing apparatus model is used, and the disk and head rotation rate, the polishing pressure, the polishing time, the type of polishing pad used and the rate of supply of the aqueous dispersion composition per unit of time are all consistent.

The "ratio" of the polishing rates referred to above can be calculated from the respective polishing rates obtained by separately polishing a copper film, a tantalum layer and/or tantalum nitride layer and an insulating film, under the same conditions. The polishing may be carried out using a wafer provided with the copper film, tantalum layer and/or tantalum nitride layer or insulating film.

The ratio ($R_{Cu}/R_{Ta}$) between the polishing rate of a copper film ($R_{Cu}$) and the polishing rate of a tantalum layer and/or tantalum nitride layer ($R_{Ta}$) is preferably no greater than ⅟30, especially no greater than ⅟30 and most preferably no greater than ⅟50. If $R_{Cu}/R_{Ta}$ is greater than ⅟20, tantalum layers cannot be polished with sufficient rate, and when the aqueous dispersion composition is used for polishing of working films or barrier metal layers formed on semiconductor substrates, a longer time will be required for polishing of barrier metal layers in the second stage of a two-stage polishing process.

The ratio ($R_{Cu}/R_{In}$) between the polishing rate of a copper film ($R_{Cu}$) and the polishing rate of an insulating film ($R_{In}$) is preferably 4 to ¼, especially 3 to ⅓ and most preferably 2 to ½. If $R_{Cu}/R_{In}$ is greater than 5, excessive polishing of copper films may occur, and when the aqueous dispersion composition is used for polishing of working films formed on semiconductor substrates, dishing may be produced at the wiring sections, making it impossible to achieve a finished surface with sufficient flatness and high precision. On the other hand, if $R_{Cu}/R_{In}$ is less than ⅕, excessive polishing of insulating films may occur, making it impossible to form satisfactory damascene wirings.

The "polishing agent" referred to above may be used inorganic particles of silica, alumina, ceria, zirconia, titania or the like. The inorganic particles are most preferably synthesized by a gas phase process. Inorganic particles obtained by gas phase processes are most preferably particles synthesized by a fumed process (high-temperature flame hydrolysis) or a process by Nanophase Technology Co. (metal vapor deposition oxidation).

The inorganic particles used are preferably colloidal silica, colloidal alumina, colloidal titania or the like synthesized by (1) a sol method involving synthesis by hydrolysis and condensation of a metal alkoxide such as tetraethoxysilane or a titanium alkoxide or the like, or (2) an inorganic colloid method and the like in which the impurities are removed by purification.

The polishing agent used may be organic particles comprising thermoplastic resins such as polyvinyl chloride; polystyrene and styrene-based copolymers; polyacetals; saturated polyesters; polyamides; polycarbonates; polyolefins and olefin-based copolymers such as polyethylene, polypropylene, poly-1-butene, poly-4-methyl-1-pentene and the like; phenoxy resins; (meth)acrylic resins such as polymethyl methacrylate; as well as acrylic-based copolymers. There may also be used organic particles comprising thermosetting resins such as epoxy resins, urethane resins and the like.

These inorganic particles and organic particles may be used alone or in combinations of two or more types, and inorganic particles may also be used in combination with organic particles.

The polishing agent may also be used organic/inorganic composite particles. Organic/inorganic composite particles need only be integrally formed to such an extent so that the organic particles and inorganic particles do not easily separate during polishing, and there are no particular restrictions on their type or structure.

The composite particles used may be prepared by polycondensation of an alkoxysilane, aluminum alkoxide, titanium alkoxide or the like in the presence of polymer particles of polystyrene, polymethyl methacrylate or the like, and bonding of polysiloxane or the like on at least the surface of the polymer particles. The resulting polycondensate may be directly bonded to the functional group of the polymer particles, or it may be bonded via a silane coupling agent.

The polycondensate does not necessarily need to be chemically bonded to the polymer particles, and the three-dimensionally formed polycondensate may by physically held on the surface of the polymer particles. Silica particles or alumina particles or the like may also be used instead of an alkoxysilane and the like. These may also be held by intertwining with the polysiloxane and the like. They may also be chemically bonded to the polymer particles by their functional groups, such as hydroxyl group and the like.

In an aqueous dispersion composition containing organic particles and inorganic particles with zeta potentials of opposite signs, the composite particles used may have their particles bonded by electrostatic force.

The zeta potentials of polymer particles are usually negative across the entire pH range, or across a wide pH range except for the low pH range; however, by using polymer particles with carboxyl groups, sulfonic acid groups or the like, it is possible to obtain polymer particles with a more definite negative zeta potential. Polymer particles with amino groups and the like have a positive zeta potential in specific pH ranges.

However, the zeta potentials of inorganic particles are highly pH-dependent and have an isoelectric point at which the potential is zero; the sign of the zeta potential reverses at around that point.

Thus, by combining specific organic particles and inorganic particles and mixing them in a pH range at which their zeta potentials are opposite signs, it is possible to form an integral composite of the organic particles and inorganic particles by electrostatic force. During the mixing, the zeta potentials may be of the same sign, and the pH adjusted thereafter to give zeta potentials of opposite signs, thereby allowing integration of the organic particles and inorganic particles.

The composite particles used may be prepared by polycondensation of an alkoxysilane, aluminum alkoxide, titanium alkoxide or the like in the presence of particles integrally composed in this manner by electrostatic force, and bonding of polysiloxane or the like on at least the surface of the particles to form a composite.

The composite particles used may be of one type, or they may be a combination of two or more types. The composite particles may also be used in combination with either or both inorganic particles and organic particles.

The mean particle size of the inorganic particles and organic particles is preferably 0.01–3 µm. A mean particle size of less than 0.01 µm will tend to reduce the polishing rate. On the other hand, a mean particle size of greater than 3 µm may result in precipitation and separation of the polishing agent, hampering efforts to achieve a stable aqueous dispersion composition for chemical mechanical polishing. The mean particle size is more preferably 0.05–1.0 µm, and even more preferably 0.1–0.7 µm, since a polishing agent with a mean particle size in this range can give a stable aqueous dispersion composition for chemical mechanical polishing that allows polishing of barrier metal layers at a sufficient rate without precipitation and separation of the particles. The mean particle size may be measured by observation under a transmission electron microscope.

The polishing agent content may be 0.05–15 parts, but is preferably 0.1–8 parts and more preferably 0.5–6 parts, to 100 parts of the aqueous dispersion composition for chemical mechanical polishing. If the polishing agent content is less than 0.3 part it may not be possible to achieve a sufficient rate of polishing, while its content is preferably not more than 15 parts because the cost will be increased and the stability of the aqueous dispersion composition for chemical mechanical polishing will be reduced.

According to the invention, the polishing rate adjustor inhibits polishing of copper films and accelerates polishing of tantalum layers and/or tantalum nitride layers.

By including a polishing rate adjustor with this specific function, it is possible to easily obtain an aqueous dispersion composition for chemical mechanical polishing with the specific polishing ratio according to the invention.

The polishing rate adjustor used may be a derivative of a heterocyclic compound with an amino group, a mercapto group, a short-chain alkyl group of 1–3 carbons or the like.

As such derivatives there may be mentioned derivatives of compounds with heteropentacycles such as benzothiazole, benzothiadiazole, benzotriazole, triazaindolizine and the like, and compounds of heterohexacycles such as diazine, triazine and the like.

As derivatives of compounds with heteropentacycles there may be mentioned, in addition to the above compounds, 2-aminobenzothiazole, 2-amino-6-methylbenzothiazole, 2-mercaptobenzothiazole, 4-amino-1,2,4-triazole, 4-amino-3-hydrazino-5-mercapto-1,2,4-triazole, 3-mercapto-1,2,4-triazole, 3-mercapto-4-methyl-4H-1,2,4-triazole, 7-hydroxy-5-methyl-1,3,4-triazaindolizine, bismuthiol, adenine and the like.

There may also be mentioned 5-amino-1H-tetrazole, 2-mercaptothiazoline, guanine, 1-phenyl-5-mercapto-1H-tetrazole, 1H-tetrazole, 1H-tetrazole-1-acetic acid, 1-(2-dimethylaminoethyl)-5-mercaptotetrazole, 4,5-dicyanoimidazole, 2-amino-4,5-dicyano-1-imidazole, 3H-1,2,3-triazolo[4,5-b]pyridin-3-ol, tolyltriazole, benzimidazole, benzofuroxane, benzo-1,2,3-thiadiazole and the like.

As derivatives of compounds with heterohexacycles there may be mentioned 3-amino-5,6-dimethyl-1,2,4-triazine, 2,4-diamino-6-diallylamino-1,3,5-triazine, benzoguanamine, thiocyanuric acid, melamine, 3-amino-5,6-dimethyl-1,2,4-triazine, phthalazine and 2,3-dicyano-5-methylpyrazine.

As polishing rate adjustors there may also be used derivatives of compounds with a heteropentacycle and a heterohexacycle. Such derivatives include adenine and guanine and the like.

Preferred among these polishing rate adjustors are 5-amino-1H-tetrazole, guanine, 3-mercapto-1,2,4-triazole, 1-phenyl-5-mercapto-1H-tetrazole, 5-methyl-1H-benzotriazole and 7-hydroxy-5-methyl-1,3,4-triazaindolizine and the like, which are mentioned in claim 3 or 11.

An especially preferred polishing rate adjustor is 5-amino-1H-tetrazole or 7-hydroxy-5-methyl-1,3,4-triazaindolizine.

The polishing rate adjustor content may be 0.001–3 parts by weight (hereunder referred to simply as "parts"), preferably 0.01–3 parts and more preferably 0.05–3 parts, to 100 parts of the aqueous dispersion composition for chemical mechanical polishing. If the polishing rate adjustor content is less than 0.001 parts, it may not be possible to achieve a sufficient rate of polishing for tantalum layers and/or tantalum nitride layers, while a longer polishing time will be required when the aqueous dispersion composition is used for polishing of barrier metal layers formed on semiconductor substrates. On the other hand, a polishing rate adjustor content of 3 parts will adequately provide the desired effect, and there is no need for a higher content.

The invention of claim 7 or 15 specifies the recommended pH range for the aqueous dispersion composition for chemical mechanical polishing.

The pH of the aqueous dispersion composition is preferably from 1 to 10. With a pH in this range it is possible to inhibit polishing of insulating films in order to prevent excessive polishing of insulating films. The pH is preferably 1–9, more preferably 2–8 and especially 3–7.5. If the pH of the aqueous dispersion composition for chemical mechanical polishing is lower than 1 or higher than 10, excessive polishing may occur on porous insulating films of low dielectric constant, such as insulating films composed mainly of silsesquioxane, thus making it impossible to form a satisfactory damascene wiring.

The pH may be adjusted with an inorganic acid such as nitric acid, sulfuric acid or phosphoric acid, or an organic acid such as formic acid, acetic acid, oxalic acid, malonic acid, succinic acid or benzoic acid or the like.

When the pH is at the acidic end, the polishing rate on copper films is slowed while the polishing rate on tantalum layers and/or tantalum nitride layers is accelerated. When such an acidic aqueous dispersion composition is used for polishing of a working film formed on a semiconductor substrate, it is possible to achieve more balanced polishing of the working film and the barrier metal layer. The aqueous dispersion composition is particularly useful for polishing in the second stage of a two-stage polishing process. On the other hand, when the pH is near neutral, the polishing rate on copper films is accelerated while the polishing rate on tantalum layers and/or tantalum nitride layers is slowed. The barrier metal layer therefore functions adequately as a stopper layer. Such a neutral aqueous dispersion composition may be used for polishing even in the first stage of a two-stage polishing process.

The aqueous dispersion composition for chemical mechanical polishing of the invention normally contains no oxidizing agent. This is because an oxidizing agent accelerates polishing of working films such as copper films while resulting in a slower polishing rate for barrier metal layers. However, an oxidizing agent may be included so long as the oxidizing agent and its content are such that the ratio of the polishing rate for copper films and tantalum layers and/or tantalum nitride layers is within the range specified by the invention. As specific examples of oxidizing agents there may be mentioned hydrogen peroxide; organic peroxides such as peracetic acid, perbenzoic acid and tert-butylhydroperoxide and the like; and nitric acid compounds such as nitric acid, iron nitrate and the like. In addition to these oxidizing agents various additives may also be included as necessary. This can further improve the stability of the dispersion composition, increase the polishing rate, and adjust the difference in polishing rates when polishing films of different hardness, such as in the case of polishing two or more types of working films.

According to the invention, the ratio of the polishing rates for copper films and tantalum layers and/or tantalum nitride layers is specified, but the aqueous dispersion composition for chemical mechanical polishing of the invention can be used for polishing of various types of working films and barrier metal layers formed on semiconductor substrates in manufacturing processes for semiconductor devices such as super LSIs and the like. Such working films include pure copper films, pure aluminum films and pure tungsten films and the like, as well as films made of alloys of copper, aluminum, tungsten and other metals. Among these types of working films, the aqueous dispersion composition of the invention is particularly useful for polishing of films with low hardness, such as pure copper film and the like. Barrier metal layers include metals such as tantalum, titanium and the like, as well as their oxides and nitrides.

Barrier metal layers are usually formed by one type of metal such as tantalum or titanium or the like, but they sometimes include tantalum and tantalum nitride on the same substrate.

The polishing of the working film or barrier metal layer of a semiconductor device can be accomplished using a commercially available chemical mechanical polishing apparatus (such as Model "LGP510" or "LGP552" by Lapmaster SFT).

For the polishing, the residual polishing agent on the polishing surface is preferably removed after the polishing. The polishing agent removal may be accomplished by a common washing method, but in the case of organic particles it may be accomplished by burning off the particles on the polishing surface at high temperature in the presence of oxygen. The burning method may involve exposure to oxygen plasma, or ashing treatment by plasma with a supply of oxygen radicals in a downflow, whereby the residual organic particles on the polishing surface can be easily removed.

Above-mentioned "semiconductor device" is used in a wide sense to include polished wafers, various devices provided with or bearing such wafers, plates manufactured from such wafers, and various devices provided with such plates (i.e., devices on which such plates are mounted).

[Preferred Mode of the Invention]

The present invention will now be explained in more detail by way of examples.

(1) Preparation of Slurry Containing Polishing Agent

After loading 100 g of fumed silica particles (product name: "Aerosil #50", Nihon Aerosil, Co. Ltd.) or fumed alumina particles (product name: "Alumina C", Nihon Aerosil, Co. Ltd.) in a 2-liter volume polyethylene bottle, ion-exchange water was added to make a total of 1000 g and the preparation was dispersed with an ultrasonic disperser.

An aqueous dispersion composition containing colloidal silica was prepared in the following manner. Specifically, 70 g of ammonia water at a 25 wt % concentration, 40 g of ion-exchange water, 175 g of ethanol and 21 g of tetraethoxysilane were loaded into a 2-liter volume flask, the mixture was heated to 60° C. while stirring at 180 rpm, and after continuing the stirring at this temperature for 2 hours, the mixture was cooled to obtain a colloidal silica/alcohol dispersion composition with a mean particle size of 97 nm. An evaporator was then used for several repetitions of a procedure in which the alcohol portion was removed while adding ion-exchange water to the dispersion composition at a temperature of 80° C., and the alcohol portion was thereby removed to prepare an aqueous dispersion composition with a solid concentration of 8 wt %.

An aqueous dispersion composition containing silica composite particles was prepared in the following manner. Specifically, 90 parts of methyl methacrylate, 5 parts of methoxypolyethyleneglycol methacrylate (product name: "NK Ester M-90G", #400, product of Shinnakamura Chemical Industries, Co. Ltd.), 5 parts of 4-vinylpyridine, 2 parts of an azo-based polymerization initiator (product name "V50", product of Wako Junyaku, Co.Ltd.) and 400 parts of ion-exchange water were loaded in a 2-liter volume flask, and the contents were heated to 70° C. while stirring under a nitrogen gas atmosphere, for 6 hours of polymerization. This yielded an aqueous dispersion composition containing polymethyl methacrylate-based particles with a mean particle size of 0.15 μm, having amino group cations and polyethylene glycol chain-bearing functional groups. The polymerization yield was 95%. After loading 100 parts of this aqueous dispersion composition containing 10 wt % polymethyl methacrylate-based particles into a 2-liter volume flask, 1 part of methyltrimethoxysilane was added and the mixture was stirred at 40° C. for 2 hours. The pH was then adjusted to 2 with nitric acid to obtain aqueous dispersion composition (a). Also, the pH of an aqueous dispersion composition containing 10 wt % of colloidal silica (product name: "Snowtex O", product of Nissan Chemical Industries, Co. Ltd.) was adjusted to 8 with potassium hydroxide to obtain aqueous dispersion composition (b). The zeta potential of the polymethyl methacrylate-based particles in aqueous dispersion composition (a) was +17 mV, and the zeta potential of the silica particles in aqueous dispersion composition (b) was −40 mV. After then gradually adding 50 parts of aqueous dispersion composition (b) to 100 parts of aqueous dispersion composition (a) over a period of 2 hours and then mixing and stirring for 2 hours, there was obtained an aqueous dispersion composition containing particles consisting of silica particles adhered to the polymethyl methacrylate-based particles. Next, 2 parts of vinyltriethoxysilane was added to this aqueous dispersion composition, and after stirring for one hour, 1 part of tetraethoxysilane was added, the mixture was heated to 60° C. and then continually stirred for 3 hours and cooled, to obtain an aqueous dispersion composition containing composite particles. The mean particle size of the composite particles was 180 nm, and the silica particles were adhered to 80% of the surface of the polymethyl methacrylate-based particles.

(2) Preparation of Aqueous Solution Containing Polishing Rate Adjustor

After placing 5 g of 5-amino-1-tetrazole, guanine, 3-mercapto-1,2,4-triazole or 7-hydroxy-5-methyl-1,3,4-triazaindolizine (HMT) in a 1-liter volume polyethylene bottle, ion-exchange water was loaded in for dissolution to prepare a total of 500 g of an aqueous solution.

(3) Examples 1–9 and Comparative Example 1

After placing a slurry containing the polishing agent of (1) above (500 g in Examples 1 and 3–6 and Comparative Example 1, and 300 g in Example 2) and the aqueous solution containing the polishing rate adjustor of (2) above (200 g in Examples 1–3, 5–6 and 8–9, 5 g in Example 4 and 100 g in Example 7) in a 2-liter volume polyethylene bottle and adjusting the pH with nitric acid, ion-exchange water was added to a total of 1000 g to prepare aqueous dispersion compositions for chemical mechanical polishing for Examples 1–9. An aqueous dispersion composition was also prepared for Comparative Example 1 in the same manner as Example 1 except that the aqueous solution of (2) above was not included. The compositions of each of the aqueous dispersion compositions (in terms of solid content) are shown in Table 1.

The aqueous dispersion compositions for chemical mechanical polishing of Examples 1–9 and Comparative Example 1 were used for polishing of an 8-inch copper film-coated wafer, an 8-inch tantalum film-coated wafer, an 8-inch tantalum nitride-coated wafer, an 8-inch plasma TEOS film-coated wafer and an 8-inch low dielectric constant porous insulating film-coated wafer.

The plasma TEOS film was a plasma oxidation film formed by plasma CVD using TEOS (tetraethoxysilane) and the like as the starting material.

The low dielectric constant porous insulating film was formed by the following method. Specifically, a mixed solution comprising 101.5 g of methyltrimethoxysilane, 276.8 g of methyl methoxypropionate and 9.7 g of tetraisopropoxytitanium/ethyl acetoacetate chelate was heated to 60° C., and a mixture of 112.3 g of γ-butyrolactone and water (weight ratio: 4.58) was added to the mixed solution dropwise over an hour. After completing dropwise addition of the mixture, reaction was conducted at 60° C. for one hour to obtain a polysiloxane sol. A 15 g portion of the polysiloxane sol was mixed with 1 g of polystyrene particles, and the resulting mixture was coated onto an ITO (indium tin oxide) substrate by spin coating to form a coating with a thickness of 1.39 µm. This was heated at 80° C. for 5 minutes and then at 200° C. for 5 minutes, and then heated at 340° C., 360° C. and 380° C. for 30 minutes each in that order under vacuum and finally heated at 450° C. for one hour to form a colorless transparent coating. Observation of a cross-section of the coating with a scanning electron microscope confirmed formation of fine pores. The dielectric constant was 1.98, the elastic modulus was 3 GPa, and the percentage of voids was 15%.

The results of the above polishing are shown in Table 1.

A Model "LGP-510" by Lapmaster SFT was used as a polishing apparatus to polish films formed on different wafers under the following conditions, and the polishing rate was calculated according to the formula given below.

Table rotation rate: 50 rpm; head rotation rate: 50 rpm; polishing pressure: 300 g/cm$^2$; aqueous dispersion composition supply rate: 100 cc/min; polishing time: 1 min.; polishing pad: Two-layer structure with product Nos. "IC1000"/"SUBA400" by Rodel-Nitta, Co. Ltd.

Polishing rate (Å/min)=(thickness of each film before polishing—thickness of each film after polishing)/polishing time.

The thickness of each film was determined by measuring the sheet resistance by the direct current 4-probe method using a resistivity measuring instrument (Model "Σ-5" by NPS Corporation.), and calculating the thickness from the sheet resistance value and the copper, tantalum, tantalum nitride resistivity based on the following formula.

TABLE 1

|  |  | Example 1 | Example 2 | Example 3 | Example 4 | Example 5 |
|---|---|---|---|---|---|---|
| Polishing agent | Type | fumed silica | fumed alumina | fumed silica | fumed silica | fumed alumina |
|  | Content | 5 | 3 | 5 | 5 | 5 |
| Polishing rate adjustor | Type |  | 5-amino-1H-tetrazole |  |  | guanine |
|  | Content | 0.2 | 0.2 | 0.2 | 0.005 | 0.2 |
| pH |  | 3 | 3 | 6.5 | 3.3 | 3.2 |
| Polishing rate (angstrom/min) |  |  |  |  |  |  |
| Cu |  | 25 | 30 | 45 | 43 | 75 |
| Ta |  | 1280 | 1550 | 1770 | 1700 | 1820 |
| TaN |  | 550 | 710 | 930 | 890 | 1570 |
| TEOS insulating film |  | 45 | 25 | 55 | 40 | 50 |
| Low dielectric constant insulating film |  | 25 | 25 | 30 | 20 | 35 |
| Polishing rate ratio |  |  |  |  |  |  |
| Cu/Ta |  | 0.02 | 0.02 | 0.03 | 0.03 | 0.04 |
| Cu/TaN |  | 0.05 | 0.04 | 0.05 | 0.05 | 0.05 |
| Cu/TEOS insulating film |  | 0.56 | 1.20 | 0.82 | 1.08 | 1.50 |
| Cu/low dielectric constant insulating film |  | 1.00 | 1.20 | 1.50 | 2.15 | 2.14 |

|  |  | Example 6 | Example 7 | Example 8 | Example 9 | Comparative Example 1 |
|---|---|---|---|---|---|---|
| Polishing agent | Type | fumed silica | colloidal silica | colloidal silica | silica composite particles | fumed silica |
|  | Content | 5 | 3 | 1 | 5 | 5 |
| Polishing rate adjustor | Type | 3-mercapto-1,2,4-triazole | HMT | 5-amino-1H-tetrazole | HMT | — |
|  | Content | 0.2 | 0.1 | 0.2 | 0.2 | — |

TABLE 1-continued

| | | | | | |
|---|---|---|---|---|---|
| pH | 3.1 | 3 | 7 | 3 | 3 |
| Polishing rate (angstrom/min) | | | | | |
| Cu | 57 | 45 | 55 | 75 | 85 |
| Ta | 1790 | 1570 | 1155 | 1515 | 275 |
| TaN | 1270 | 1055 | 1215 | 1550 | 195 |
| TEOS insulating film | 55 | 35 | 50 | 65 | 40 |
| Low dielectric constant insulating film | 25 | 10 | 15 | 20 | 35 |
| Polishing rate ratio | | | | | |
| Cu/Ta | 0.03 | 0.03 | 0.05 | 0.05 | 0.31 |
| Cu/TaN | 0.04 | 0.04 | 0.05 | 0.05 | 0.44 |
| Cu/TEOS insulating film | 1.04 | 1.29 | 1.10 | 1.15 | 2.13 |
| Cu/low dielectric constant insulating film | 2.28 | 4.50 | 3.67 | 3.75 | 2.43 |

Film thickness (Å)=[sheet resistance value ($\Omega/cm^2$)× copper, tantalum or tantalum nitride resistivity ($\Omega/cm$)]×$10^8$ The plasma TEOS resistivity was measured with a model "FTP500" Optical Interference Film Thickness Probe by SENTECH corporation.

According to the results shown in Table 1, the aqueous dispersion compositions for chemical mechanical polishing of Examples 1–9 that contained polishing rate adjustors had ratios between the polishing rates for the copper film and the tantalum film ($R_{Cu}/R_{Ta}$) and ratios between the polishing rates for copper film and TEOS insulating film or low dielectric constant insulating film ($R_{Cu}/R_{In}$) of 0.02–0.05, 0.56–1.50 and 1.00–4.50, respectively, which were all within the range of the invention, including Example 4 which had a very low polishing rate adjustor content. For the tantalum nitride film, the polishing rate was slower than for the tantalum film but the ratio of the polishing rates for the copper film and tantalum nitride film ($R_{Cu}/R_{TaN}$) was 0.04–0.05, which was also within the range of the invention. Thus, it was concluded that the aqueous dispersion compositions of Examples 1–9 can be used to give finished surfaces with adequate flatness and high precision, for polishing of working films and barrier metal layers formed on semiconductor substrates. With the aqueous dispersion composition of Comparative Example 1, however, there was no problem with the ratio of the polishing rates for the copper film and the insulating film, but the ratio of the polishing rates for the copper film and the tantalum or tantalum nitride film was large (0.31 and 0.44, respectively), suggesting that their finished surfaces will have inadequate flatness.

What is claimed is:

1. An aqueous dispersion composition for chemical mechanical polishing for use in the manufacture of semiconductor devices, comprising a polishing agent, water and a polishing rate adjustor,
    wherein said polishing rate adjustor is one selected from the group consisting of 4-amino-1,2,4-triazole, 4-amino-3-hydrazino-5-mercapto-1,2,4-triazole, 3-mercapto-1,2,4-triazole, 3-mercapto-4-methyl-4H-1,2,4-triazole, 7-hydroxy-5-methyl-1,3,4-triazaindolizine, 1-phenyl-5-mercapto-1H-tetrazole, 1-(2-dimethylaminoethyl)-5-mercaptotetrazole, 3-amino-5,6-dimethyl-1,2,4-triazine, 2,4-diamino-6-diallylamino-1,3,5-triazine, benzoguanamine, thiocyanuric acid, melamine, 3-amino-5,6-dimethyl-1,2,4-triazine, adenine and guanine.

2. An aqueous dispersion composition for chemical mechanical polishing for use in the manufacture of semiconductor devices according to claim 1, wherein said polishing rate adjustor inhibits polishing of a copper film and accelerates polishing of a tantalum layer and/or tantalum nitride layer.

3. An aqueous dispersion composition for chemical mechanical polishing for use in the manufacture of semiconductor devices according to claim 2, wherein said polishing rate adjustor is one selected from the group consisting of, guanine, 3-mercapto-1,2,4-triazole, 1-phenyl-5-mercapto-1H-tetrazole, and 7-hydroxy-5-methyl-1,3,4-triazaindolizine.

4. An aqueous dispersion composition for chemical mechanical polishing for use in the manufacture of semiconductor devices according to claim 3, wherein the content of said polishing rate adjustor is 0.05–3 parts with respect to 100 parts of the aqueous dispersion composition for chemical mechanical polishing.

5. An aqueous dispersion composition for chemical mechanical polishing for use in the manufacture of semiconductor devices according to claim 3, wherein said polishing agent comprises silica particles, alumina particles or organic/inorganic composite particles.

6. An aqueous dispersion composition for chemical mechanical polishing for use in the manufacture of semiconductor devices, comprising a polishing agent, water and a polishing rate adjustor, wherein, when polishing a copper film, a tantalum layer and/or tantalum nitride layer and an insulating film under the same conditions, the ratio ($R_{Cu}/R_{Ta}$) between the polishing rate of the copper film ($R_{Cu}$) and the polishing rate of the tantalum layer and/or tantalum nitride layer ($R_{Ta}$) is no greater than 1/20,
    wherein said polishing rate adjustor inhibits polishing of said copper film and accelerates polishing of said tantalum layer and/or tantalum nitride layer, and
    wherein said polishing rate adjustor is one selected from the group consisting of guanine, 3-mercapto-1,2,4-triazole, 1-phenyl-5-mercapto-1H-tetrazole, and 7-hydroxy-5-methyl-1,3,4-triazaindolizine.

7. An aqueous dispersion composition for chemical mechanical polishing for use in the manufacture of semiconductor devices according to claim 6, wherein the content of said polishing rate adjustor is 0.05–3 parts with respect to 100 parts of the aqueous dispersion composition for chemical mechanical polishing.

8. An aqueous dispersion composition for chemical mechanical polishing for use in the manufacture of semiconductor devices according to claim 5, wherein said polishing agent comprises silica particles, alumina particles or organic/inorganic composite particles.

9. An aqueous dispersion composition for chemical mechanical polishing for use in the manufacture of semiconductor devices, comprising a polishing agent, water and a polishing rate adjustor, wherein, when polishing a copper film, a tantalum layer and/or tantalum nitride layer and an insulating film under the same conditions, the ratio ($R_{Cu}/R_{Ta}$) between the polishing rate of the copper film ($R_{Cu}$) and the polishing rate of the tantalum layer and/or tantalum nitride layer ($R_{Ta}$) is no greater than 1/20, and wherein said polishing rate adjustor is one selected from the group consisting of 4-amino-1,2,4-triazole, 4-amino-3-hydrazino-5-mercapto-1,2,4-triazole, 3-mercapto-1,2,4-triazole, 3-mercapto-4-methyl-4H-1,2,4-triazole, 7-hydroxy-5-methyl-1,3,4-triazaindolizine, 1-phenyl-5-mercapto-1H-tetrazole, 1-(2-dimethylaminoethyl)-5-mercaptotetrazole, 3-amino-5,6-dimethyl-1,2,4-triazine, 2,4-diamino-6-diallylamino-1,3,5-triazine, benzoguanamine, thiocyanuric acid, melamine, 3-amino-5,6-dimethyl-1,2,4-triazine, adenine and guanine.

10. An aqueous dispersion composition for chemical mechanical polishing for use in the manufacture of semiconductor devices, comprising a polishing agent, water and a polishing rate adjustor, and containing no oxidizing agent, wherein said polishing rate adjuster is one selected from the group consisting of 4-amino-1,2,4-triazole, 4-amino-3-hydrazino-5-mercapto-1,2,4-triazole, 3-mercapto-1,2,4-triazole, 3-mercapto-4-methyl-4H-1,2,4-triazole, 7-hydroxy-5-methyl-1,3,4-triazaindolizine, 5-amino-1H-tetrazole, 1-phenyl-5-mercapto-1H-tetrazole, 1-(2-dimethylaminoethyl)-5-mercaptotetrazole, 3-amino-5,6-dimethyl-1,2,4-triazine, 2,4-diamino-6-diallylamino-1,3,5-triazine, benzoguanamine, thiocyanuric acid, melamine, 3-amino-5,6-dimethyl-1,2,4-triazine, adenine and guanine.

11. An aqueous dispersion composition for chemical mechanical polishing for use in the manufacture of semiconductor devices according to claim 10, wherein said polishing rate adjustor inhibits polishing of a copper film and accelerates polishing of a tantalum layer and/or tantalum nitride layer.

12. An aqueous dispersion composition for chemical mechanical polishing for use in the manufacture of semiconductor devices according to claim 11, wherein said polishing rate adjustor to one selected from the group consisting of 5-amino-1H-tetrazole, guanine, 3-mercapto-1,2,4-triazole, 1-phenyl-5-mercapto-1H-tetrazole, and 7-hydroxy-5-methyl-1,3,4-triazaindolizine.

13. An aqueous dispersion composition for chemical mechanical polishing for use in the manufacture of semiconductor devices according to claim 12, wherein the content of said polishing rate adjustor is 0.05–3 parts with respect to 100 parts of the aqueous dispersion composition for chemical mechanical polishing.

14. An aqueous dispersion composition for chemical mechanical polishing for use in the manufacture of semiconductor devices according to claim 10, wherein said polishing agent comprises silica particles, alumina particles or organic/inorganic composite particles.

15. An aqueous dispersion composition for chemical mechanical polishing for use in the manufacture of semiconductor devices, comprising a polishing agent, water, and a polishing rate adjustor, and containing no oxidizing agent, wherein, when polishing a copper film, a tantalum layer and/or tantalum nitride layer and an insulating film under the same conditions, the ratio ($R_{Cu}/R_{Ta}$) between the polishing rate of the copper film ($R_{Cu}$) and the polishing rate of the tantalum layer and/or tantalum nitride layer ($R_{Ta}$) is no greater than 1/20.

16. An aqueous dispersion composition for chemical mechanical polishing for use in the manufacture of semiconductor devices according to claim 15, wherein the ratio ($R_{Cu}/R_{In}$) between the polishing rate of the copper film ($R_{Cu}$) and the polishing rate of the insulating film ($R_{In}$) is from 5 to 1/5.

17. An aqueous dispersion composition for chemical mechanical polishing for use in the manufacture of semiconductor devices according to claims 15, wherein said polishing rate adjustor is one selected from the group consisting of 4-amino-1,2,4-triazole, 4-amino-3-hydrazino-5-mercapto-1,2,4-triazole, 3-mercapto-1,2,4-triazole, 3-mercapto-4-methyl-4H-1,2,4-triazole, 7-hydroxy-5-methyl-1,3,4-triazaindolizine, 5-amino-1H-tetrazole, 1-phenyl-5-mercapto-1H-tetrazole, 1-(2-dimethylaminoethyl)-5-mercaptotetrazole, 3-amino-5,6-dimethyl-1,2,4-triazine, 2,4-diamino-6-diallylamino-1,3,5-triazine, benzoguanamine, thiocyanuric acid, melamine, 3-amino-5,6-dimethyl-1,2,4-triazine, adenine and guanine.

18. An aqueous dispersion composition for chemical mechanical polishing for use in the manufacture of semiconductor devices according to claim 17, wherein said polishing rate adjustor inhibits polishing of said copper film and accelerates polishing of said tantalum layer and/or tantalum nitride layer.

19. An aqueous dispersion composition for chemical mechanical polishing for use in the manufacture of semiconductor devices according to claim 18, wherein said polishing rate adjustor is one selected from the group consisting of 5-amino-1H-tetrazole, guanine, 3-mercapto-1,2,4-triazole, 1-phenyl-5-mercapto-1H-tetrazole and 7-hydroxy-5-methyl-1,3,4-triazaindolizine.

20. An aqueous dispersion composition for chemical mechanical polishing for use in the manufacture of semiconductor devices according to claim 19, wherein the content of said polishing rate adjustor is 0.05–3 parts with respect to 100 parts of the aqueous dispersion composition for chemical mechanical polishing.

21. An aqueous dispersion composition for chemical mechanical polishing for use in the manufacture of semiconductor devices according to claim 19, wherein said polishing agent comprises silica particles, alumina particles or organic/inorganic composite particles.

* * * * *